United States Patent [19]

Amin

[11] 3,787,219

[45] Jan. 22, 1974

[54] $CATIO_3$-CRYSTALLIZABLE GLASS DIELECTRIC COMPOSITIONS

[75] Inventor: Rajnikant Babubhai Amin, Wilmington, Del.

[73] Assignee: E. I. du Pont de Nemours and Company, Wilmington, Del.

[22] Filed: Sept. 22, 1972

[21] Appl. No.: 291,174

[52] U.S. Cl. .................. 106/73.3, 106/39.8, 106/48, 106/52, 106/54, 106/73.33, 317/258

[51] Int. Cl. .............................................. C03c 3/22

[58] Field of Search ........ 106/73.3, 52, 54, 48, 39.8

[56] References Cited

UNITED STATES PATENTS

| | | | |
|---|---|---|---|
| 3,464,836 | 9/1969 | Pendleton et al. | 106/52 |
| 3,586,522 | 6/1971 | Hoffman | 106/52 |
| 3,637,425 | 1/1972 | McMillan et al. | 106/52 |
| 3,035,937 | 5/1962 | Baldauf et al. | 106/73.31 |
| 3,279,947 | 10/1966 | Kaiser | 106/73.31 |

*Primary Examiner*—Helen M. McCarthy

*Attorney, Agent, or Firm*—James A. Forstner

[57] ABSTRACT

Powder compositions useful for producing dielectric layers in electronic devices at firing temperatures below 1000°C. The resultant dielectrics exhibit high Q (above 700) and reduced, or even negative, TCC. The compositions comprise 1-40% by weight of calcium titanate and 99-60% of certain lead-free crystallizable glasses and are optionally dispersed in an inert liquid vehicle.

10 Claims, No Drawings

$CaTiO_3$-CRYSTALLIZABLE GLASS DIELECTRIC COMPOSITIONS

BACKGROUND OF THE INVENTION

This invention relates to printed circuits, and more particularly to novel compositions for producing dielectric layers for use in such circuits.

Thick film technology employs printing techniques (such as screen or stencil printing) to deposit conductor, insulator, etc., compositions (usually dispersions of inorganic solids in a liquid inert vehicle) in desired patterns on a dielectric substrate. Bacher et al. U.S. Pat. No. 3,683,245 and Bergmann U.S. Pat. No. 3,679,943 disclose capacitors made by printing successive conductor and insulator layers on a substrate.

Several determinations used to assess the quality of capacitors are temperature coefficient of capacitance (TCC) and quality factor (Q). TCC of capacitors is expressed in ppm/°C. and was calculated by measuring the capacitance change between −50°C. and +25°C., and between +25°C. and +125°C., using a General Radio Automatic Capacitance Bridge. Q is a measure of loss of power in a resonant circuit (the higher the Q, the less the power loss); Q was determined herein with a Marconi Instruments Ltd. Q-meter.

Certain consumer electronic circuits require high stability capacitors with a negative temperature coefficient of capacitance (TCC), as well as a high qualtiy factor (Q) even at 1 megahertz. The dielectric constant for these capacitor dielectrics is usually low (in the range of 10 to 50 ). Thick film printable dielectric compositions with negative TCC and high Q at one megahertz are not presently available; hence, discrete chip capacitors are utilized for the hybrid circuits rather than thick film technology. Chip capacitors are expensive and require a separate soldering step to attach the chip to the circuit.

The crystallizable glass compositions used in thick film techniques (such as that of Hoffman U.S. Pat. No. 3,656,984, in which the major crystallizing phase is a barium-aluminum feldspar, $BaAl_2Si_2O_8$), have high Q values, but a positive TCC, and hence cannot be used for certain applications.

There is a need for dielectric compositions capable of producing thick film capacitors having a high quality factor (above 700) even at one megahertz, and reduced TCC. Preferably, a negative TCC is desired. A further goal is dielectric compositions which can be fired or sintered at temperatures below 1000°C.; such firing temperatures permit firing with typical low melting electrode compositions often used in manufacturing thick film circuitry.

SUMMARY OF THE INVENTION

This invention relates to power (finely divided) compositions useful in producing dielectric layers for use in printed circuits. The powder composition consists essentially of 1–40 percent calcium titanate and 60–99 percent of a partially crystallizable glass frit, each finely divided. The glasses have components and proportions set forth in Table I.

TABLE I

Glass Compositions

| Component | Weight Percent Preferred | Weight Percent Operative |
|---|---|---|
| $SiO_2$ | 30–33 | 25–40 |
| $TiO_2$ | 8–10 | 5–15 |
| $Al_2O_3$ | 10–12 | 7–12 |
| BaO | 12–26 | 10–30 |
| ZnO | 10–26 | 10–26 |
| CaO | 6–10 | 2–10 |
| $B_2O_3$ | 2– 8 | 2– 8 |
| MgO | 0– 2 | 0– 2 |
| $Bi_2O_3$ | 0– 4 | 0– 4 |
| (Total BaO plus ZnO | 30–40 | 30–40) |

The compositions may be printed (usually screen printed) onto a substrate either dry or as a dispersion in an inert liquid vehicle. In the dispersion generally there are 0.4 to 9 parts of such inorganic solids per part of vehicle (by weight). When the glasses of the present invention are fired, a dense dielectric is obtained. The compositions of the present invention are fireable below 1000°C. and hence are very useful with thick film circuits which often employ low-melting metals. Often these compositions are fired at a temperature in the range of 800°–950°C. The glass portion (exclusive of calcium titanate) contains 20–48 percent by weight crystals dispersed in a glassy matrix. The crystals are celsian as the major component, in addition to lesser amounts of sphene and zinc orthosilicate. The resultant dielectric layers produce capacitors having high Q (above 700) and reduced TCC, even negative TCC with certain preferred compositions having 15–40 percent calcium titanate.

The dense, high Q dielectric layers produced by firing (sintering) the compositions of the present invention are comprised of particles of calcium titanate and crystals of celsian in a glassy matrix. Minor crystalline phases present are sphene and zinc orthosilicate.

DETAILED DESCRIPTION

In the improved powder compositions of the present invention there are two essential components, calcium titanate and the glass of Table 1. The glasses in the compositions of this invention exploit various ingredients in a critical combination of proportions such that they possess highly desireable properties.

A physical mixture of the glass ingredients (or precursors thereof) form stable glasses when quenched from the molten state. In making the glasses of the present invention, there are employed certain critical protions of glass formers. When the glasses have been finely ground, and mixed with clacium titante, and the resultant composition has been printed and fired on substrates, nucleation and partial crystallization of the glass are carried out in a single step, during the same relatively simple firing schedule, and, consequently, much more rapidly than with conventional crystallizing glasses. Once the glass softens and is held at the firing temperature for a sufficient period of time to crystallize, it becomes less thermoplastic.

The partially crystallized glass in the fired dielectric of the present invention contains a crystalline phase comprising 20–48 percent by weight of the total weight of glass and crystals (exclusive of calcium titanate). The crystals formed on firing are celsian ($BaAl_2Si_2O_8$) as the major crystalline phase, with sphene ($CaTiSiO_5$)

and zinc orthosilicate [$(ZnO)_2SiO_2$] as minor crystalline phases. Traces of $TiO_2$ may be present upon firing above 950°C. These crystalline phases are identified by X-ray diffraction. Their relative abundance in the fired dielectric is, of course, dependent upon the length and temperature of firing, and the composition of the particular glass used as the starting material. A glass of 30% $SiO_2$, 10% $TiO_2$, 10% $Al_2O_3$, 26% BaO, 12% ZnO, 6% CaO, 4% $B_2O_3$ and 2% MgO, e.g., when heated in the absence of calcium titanate at a peak temperature of 850°–900°C. in a 45-minute cycle in a belt furnace, with 10 minutes at peak temperature, yields a dielectric having over 40 percent (but not more than 48 percent) crystals, 36 percent being celsian, 5–6 percent being sphene and at most 2 percent being zinc orthosilicate.

The proprotions of the constituents in the unfired glasses in the compositions of the present invention, and, therefore, in the fired dielectrics of the present invention, have been found to be important, as is shown in the examples and comparative showings below. The glass is a lead-free partially crystallizable glass, with the following constituents. Silicon dioxide determines the softening characteristics, thermal expansion and chemical durability of the fired dielectric and is a constituent of the fired crystalline phase. The glasses contain 25–40 percent by weight silica.

Titanium dioxide is the crystallization catalyst and is also a constituent of the crystalline phase. Titanium dioxide is 5–15 percent of the glass.

Alumina is a constituent of the primary crystal phase which is produced upon firing, celsian. Alumina is present as 7–12 percent of the glass. Barium oxide and zinc oxide are in the crystal phase produced and are present as 12–30 percent and 10–26 percent, respectively, of the glass, the total amount of these oxides being in the range 30–40 percent. These oxides contribute to the low-firing capability of these glasses.

Calcium oxide is present as 2–10 percent of the glass to lower the melting point of the glass so that glass can be melted in conventional furnaces without difficulty. It is also one of the constituents of crystalline phase $CaTiSiO_5$.

Boric oxide (2–8 percent) is present in the glass as a viscosity reducer. Optional are MgO (0–4%) and $Bi_2O_3$ (0–4 percent), preferred and optimum proportions of all these glass components being set forth in Table I.

It should be understood that there may be other constituents which can be used in making the glasses of this invention, and, consequently, the partially crystallized dielectrics of the present invention, and which do not introduce strong adverse effects.

The glasses in the present invention are prepared from suitable bath compositions of oxides (or oxide precursors) by melting any suitable batch composition which yields the prescribed compounds in the prescribed proportions. Metal oxides form stable glasses when quenched from the molten state, to produce the glasses. A physical mixture of metal oxides or oxide precursors such as metal hydroxides or carbonates may be employed. The batch composition to be utilized in preparing the glasses is first mixed and then melted to yield a substantially homogeneous fluid glass. The temperature maintained during this melting step is not critical, but is usually within the range 1450°–1500°C., so that the rapid homogenation of the melt can be obtained. After a homogeneous fluid glass is obtained, it is generally poured into water or other liquid to form a glass frit.

The calcium titanate and glasses used in the present invention are each in finely divided form. The glass frit and calcium titanate are, therefore, ground finely in a conventional mill (ball or vibratory) prior to dispersion in vehicle (if any) and printing. Powders having an average particle size in the range 1–15 microns in diameter are generally preferred, and those having an average particle size not exceeding 10 microns are distinctly preferred. Generally, substantially no particles in this preferred particle size should exceed 37 microns, that is the particles should pass through a 400-mesh screen (U.S. standard sieve scale).

The compositions of the present invention are printed as a film onto prefired metallized ceramic dielectric substrates in the conventional manner. Generally, screen or stencil techniques are preferably employed. The composition is printed as a finely divided powder either dry or in the form of a dispersion in an inert liquid vehicle. Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetate and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of inert vehicle to solids may vary considerably and depends upon the manner in which the dispersion is to be applied and the kind of vehicle used. Generally, from 0.4 to 9 parts by weight of solids per part by weight of vehicle will be used to produce a dispersion of the desired consistency. Preferably, 2–4 parts of solids per part of vehicle will be used.

As indicated above, the compositions of the present invention are printed onto prefired ceramic substrates (with prefired metallizations thereon), after which the printed substrate is refired to mature the glass in the compositions of the present invention and so induce partial cyrstallization of the glass in the resultant dielectric. Generally, the composition is fired in the temperature range 800°–950°C. to mature the glass therein and from the partially crystalline dielectric. Preferably, the firing is conducted at a peak temperature of about 875°–900°C., typically for a total of up to 45 minutes with 10 minutes being at peak temperature.

The present invention is illustrated by the following examples, and is compared with the inferior results obtained in the showings. In the examples and elsewhere in the specification and claims, all parts, ratios, and percentages of materials or components are by weight. The titanatas and glass frits used therein all were finely divided (passed through 400-mesh screen).

The dielectric constant was determined from the capacitance (C) in picofarads, dielectric constant (K) being calculated as follows:

$$K = C \times t/0.224 \times A$$

where $t$ and A are thickness and area of the dielectric in inches. TCC and Q were determined as described above.

EXAMPLES 1–4

A palladium-silver electrode composition (Pd/Ag ratio ¼, with small amounts of inorganic binder) was printed using a 200-mesh screen on a prefired 96 percent alumina dense substrate; the printed substrates were each fired at 900°C. for 10 minutes to sinter the electrodes.

The dielectric composition of the present invention was then printed twice (200-mesh screen) as a dispersion of 3.30 parts of dielectric powder in 1.15 parts of an inert liquid vehicle, with an intermediate drying step. The dielectric powder composition is set forth in Table II, expressed as weight percent of inorganic solids. The vehicle was 10 percent ethyl cellulose and 90 percent terpineol. A top electrode (Pd/Ag ratio ½, with small amounts of inorganic binder) was printed (165-mesh screen) over the dielectric and dried. The dielectric layer and top electrode were cofired at 900°C. for 10 minutes.

Table II lists the properties found in the resultant fired capacitors. The dielectric constant (K) and quality factor (Q) (at 1 megahertz) were each excellent for each capacitor in Examples 1–4. The TCC was also low, and in the case of Examples 2–4, was negative. The TCC for Example 1, although not negative due to the low level of calcium titanate (10 percent), is useful in some applications.

COMPARATIVE SHOWINGS

In the comparative showings the procedure of Examples 1–4 was used to prepare capacitors, except that the solids/vehicle ratio in the dielectric printing step was 7/3. Various titanates and glasses not of the present invention were shown to be inferior to the compositions of the present invention.

COMPARATIVE SHOWINGS A AND B

A dielectric composition having a calcium titanate/glass ratio within the present invention, but using glasses not of the present invention, was found to give markedly inferior results to those obtained with the composition of the present invention. In Showing A a noncrystallizable glass was used, and in Showing B a partially crystallizable glass was used (the latter was a glass of Hoffman U.S. Pat. No. 3,684,536). Resultant properties are set forth in Table II. Inferior Q is found in Showings A and B; in Showing A, the TCC is markedly inferior.

COMPARATIVE SHOWINGS C AND D

Strontium titanate was used instead of calcium titanate of the present invention. In Showing C a partially crystallizable glass not of the present invention was used (that of Showing B), but in Showing D the partially crystallizable glass of the present invention was used. Strontium titanate did lower TCC, but Q is lower than with calcium titanate, even using the glass of the present invention.

TABLE II

| | Example No. | | | | Comparative Showing | | | |
|---|---|---|---|---|---|---|---|---|
| | 1 | 2 | 3 | 4 | A | B | C | D |
| Dielectric Composition | | | | | | | | |
| Glass Frit No.* | 1 | 1 | 1 | 1 | 2 | 3 | 3 | 1 |
| Glass Frit | 90 | 85 | 80 | 70 | 85 | 85 | 85 | 85 |
| Calcium Titanate | 10 | 15 | 20 | 30 | 15 | 15 | — | — |
| Strontium Titanate | — | — | — | — | — | — | 15 | 15 |
| Quality Factor (Q) at 1 megahertz | 1470 | 1198 | 1160 | 787 | 251 | 505 | 570 | 573 |
| TCC (ppm/°C.) | | | | | | | | |
| at 25°C. to 125°C. | +41 | −22 | −73 | −233 | +544 | −10 | −97 | −67 |
| at −50°C. to 25°C. | +30 | −48 | −149 | −367 | +118 | −15 | −289 | −120 |
| Dielectric Constant (K) at 25°C. and 1 kilohertz | 13.7 | 17.8 | 23.8 | 24.3 | 11.8 | 25.5 | 22.0 | 18.4 |

* Glass No. 1 of the present invention contained 30.0% $SiO_2$, 10.0% $TiO_2$, 4.0% $B_2O_3$, 10.0% $Al_2O_3$, 26.0% BaO, 12.0% ZnO, 6.0% CaO, and 2.0% MgO.
Glass No. 2 contained 56.5% $SiO_2$, 4.5% $B_2O_3$, 9.1% $Al_2O_3$, 17.2% PbO, 2.4% $Na_2O$, 1.7% $K_2O$ and 8.6% CaO.
Glass No. 3 contained 27.0% $SiO_2$, 12.0% $TiO_2$, 11.0% $Al_2O_3$, 8.0% BaO, 32.0% PbO, and 10% ZnO.

I claim:

1. A powder composition useful for printing dielectric layers, consisting essentially of, by weight, 1–40 percent calcium titanate and 60–99% of a lead-free, crystallizable glass frit of
25–40% $SiO_2$
5–15% $TiO_2$
7–12% $Al_2O_3$
10–30% BaO
10–26% ZnO
2–10% CaO
2–8% $B_2O_3$
0–2% MgO and
0–4% $Bi_2O_3$,
the total of BaO and ZnO being 30–40 percent of the glass.

2. A composition according to claim 1 dispersed in an inert liquid vehicle, there being 0.4–9 parts of said composition per part of vehicle, by weight.

3. A composition according to claim 1 wherein the glass frit is of, by weight,
30–33% $SiO_2$
8–10% $TiO_2$
10–12% $Al_2O_3$
12–26% BaO
10–26% ZnO
6–10% CaO
2–8% $B_2O_3$
0–2% MgO
0–4% $Bi_2O_3$ 4. A composition according to claim 3 dispersed in an inert liquid vehicle, there being 0.4–9 parts of said composition per part of vehicle, by weight.

5. A composition according to claim 1 of 15–40 percent calcium titanate and 85–60 percent glass frit.

6. A composition according to claim 3 15–40 percent calcium titanate and 85–60 percent glass frit.

7. A dense, high Q, dielectric useful in electronic devices which is the fired composition of claim 1 and which comprises a glassy matrix having dispersed therein particles of calcium titanate and crystals of celsian.

8. A dense, high Q, dielectric useful in electronic devices which is the fired composition of claim 3 and which comprises a glassy matrix having dispersed therein particles of calcium titanate and crystals of celsian.

9. A dense, high Q, dielectric useful in electronic devices which is the fired composition of claim 5 and which comprises a glassy matrix having dispersed therein particles of calcium titanate and crystals of celsian.

10. A dense, high Q, dielectric useful in electronic devices which is the fired composition of claim 6 and which comprises a glassy matrix having dispersed therein particles of calcium titanate and crystals of celsian.

* * * * *